United States Patent [19]
Johnson et al.

[11] Patent Number: 5,481,123
[45] Date of Patent: Jan. 2, 1996

[54] LIGHT EMITTING DIODE WITH IMPROVED BEHAVIOR BETWEEN ITS SUBSTRATE AND EPITAXIAL LAYER

[75] Inventors: Ralph H. Johnson, Murphy; Edward W. Mehal, Blue Ridge, both of Tex.

[73] Assignee: Honeywell Inc., Minneapolis, Minn.

[21] Appl. No.: 359,804

[22] Filed: Dec. 20, 1994

[51] Int. Cl.$^6$ ............................................. H01L 33/00
[52] U.S. Cl. ...................... 257/102; 257/103; 257/461; 257/463
[58] Field of Search ............................... 257/184, 185, 257/102, 103, 461, 463

[56] References Cited

U.S. PATENT DOCUMENTS

| | | | |
|---|---|---|---|
| 3,746,943 | 7/1973 | Aoki et al. | 257/86 X |
| 3,770,518 | 11/1973 | Rosztoczy et al. | 257/463 X |
| 4,218,270 | 8/1980 | Hasegawa et al. | 257/94 X |
| 4,591,654 | 5/1986 | Yamaguchi et al. | 257/461 X |
| 4,845,049 | 7/1989 | Sunakawa | 257/280 X |

Primary Examiner—William Mintel
Attorney, Agent, or Firm—William D. Lanyi

[57] ABSTRACT

A group III–V substrate is doped with tellurium or another group VI element, instead of silicon, in order to avoid the conductivity type conversion that could otherwise occur if the group V element is boiled off during high temperature processing. For example, a gallium arsenide substrate can be doped with tellurium and then a gallium arsenide epitaxial layer can be deposited on a surface. If the substrate is heated beyond a predetermined temperature during the processing of the device, the arsenic can boil away from the substrate and leave arsenic vacancies. If the silicon is used as the substrate dopant, the silicon can migrate to the arsenic vacancies and replace arsenic, particularly proximate the substrate surface. If, on the other hand, tellurium or another group VI element is used as the substrate dopant, this change in conductivity type can not occur. Therefore, the conductivity conversion proximate the substrate surface will not create a thyristor-like behavior that is significantly disadvantageous.

4 Claims, 1 Drawing Sheet

5,481,123

LIGHT EMITTING DIODE WITH IMPROVED BEHAVIOR BETWEEN ITS SUBSTRATE AND EPITAXIAL LAYER

BACKGROUND OF THE INVENTION

1. Field of the Invention

The present invention is generally related to light emitting diodes and, more particularly, to a light emitting diode made with a doped gallium arsenide substrate on which a gallium arsenide epitaxial layer is deposited.

Description of the Prior Art

Silicon-doped gallium arsenide light emitting diodes are typically grown on silicon-doped gallium arsenide substrates. Depending on the precise process conditions employed during the various manufacturing processes, the surface of the N-type silicon-doped substrate can convert to a P-type layer which results in deleterious thyristor-like behavior. This type of behavior results in the light emitting diode being useless. This problem is wide spread in the industry and is typically exacerbated when the substrate is heated beyond certain temperatures.

The cause of the P-type conversion is related to the fact that silicon, which is proximate the surface of the substrate, changes from the gallium sites to the arsenic sites during the high temperature saturation of the melts. This effect is caused primarily by the high number of arsenic vacancies which are caused as the arsenic boils off from the substrate at elevated temperatures. The large quantity of arsenic vacancies drives the silicon to the arsenic sites. Silicon, on an arsenic site, is an acceptor and, therefore, a layer of P-type conductivity material is created at the surface of the substrate. Silicon is the dopant in the substrate and is uniformly distributed. The chemical concentration of the silicon is approximately $1*1020$ atoms per cubic centimeter. Silicon is distributed on both arsenic and gallium sites. In melt grown silicon doped gallium arsenide, which is grown at approximately 1240 degrees centigrade, the silicon atoms are distributed so that there is a net donor concentration of approximately $1*10^{18}$ electrons per cubic centimeter. The site distribution for the silicon in gallium arsenide is a function of the growth method, the temperature, the growth conditions and time. A condition that is at equilibrium as 1240 degrees centigrade is not necessarily the equilibrium condition at 100 degrees centigrade. The material will attempt to achieve equilibrium, but the rate at which it achieves equilibrium can vary significantly. One problem that can occur when a slice of gallium arsenide is heated is that the more volatile constituents may evaporate from its exposed surfaces. In the case of a slice of gallium arsenide, arsenic is more volatile than the other constituents in the material (i.e. gallium and silicon). Therefore, arsenic will evaporate from the surface of a slice of gallium arsenide. The amount and rate of evaporation is a function of temperature. The rate increases greatly at higher temperatures. When arsenic leaves the surface of the gallium arsenide, empty spaces remain in the gallium arsenide slice's crystal lattice. The empty spaces are arsenic vacancies. The arsenic vacancies can either stay where they exist or diffuse into the bulk of the gallium arsenide slice. The rate at which they diffuse is a function of temperature and the concentration of the arsenic vacancies. The excess arsenic vacancies create a condition in which the silicon atoms are in a nonequilibrium state with respect to the crystal lattice and some silicon atoms in the vicinity of the excess arsenic vacancies change sites from either interstitial or gallium to the arsenic site. This site change results in a net donor decrease and more P-type conductivity material. The site changing is also a function of temperature and constituent composition. When sufficient silicon atoms change sites, the gallium arsenide material can change from N conductivity type material to P conductivity type material.

In an article titled "High-Efficiently Graded-Band-Gap $Ga_{1-x}Al_xAs$ Light-Emitting Diodes" by L. Ralph Dawson in the June 1977 edition of the Journal of Applied Physics, Volume 48, Number 6, describes the use of a gallium aluminum arsenide epitaxial layer in which an LED is manufactured by silicon-doping the gallium aluminum arsenide epitaxial layer. This material is described as being superior to gallium arsenide which is silicon-doped. This article describes the preparation of a graded gallium aluminum arsenide epitaxial layer on a gallium arsenide substrate. In the process, the author describes the substrate as being etched away and the device uses only the grown gallium aluminum arsenide material that remains. Since the substrate is etched away during this process, if there was a surface type conversion occurring in the material, it was removed and thus does not become a factor in the performance of the device. As is known to those skilled in the art, the NPNP condition can also be averted by etching the substrate immediately before putting the epitaxial layer on it in a reactor.

The problem described above results in a P-type conductivity region on the upper surface of the substrate. When the epitaxial layer is grown on the upper surface of the substrate, the initial epitaxial growth process results in an N-type conductivity type region within the epitaxial layer immediately proximate the upper surface of the substrate. Following the deposition of that N-type conductivity region, the remaining portion of the epitaxial layer is of P-type conductivity material. The existence of the P-type conductivity region at the upper portion of the substrate, proximate its upper surface, results in the creation of an NPNP device that exhibits thyristor-like behavior. Naturally, this type of behavior in a light emitting diode structure is severely disadvantageous and results in an unusable device that must be scrapped. This situation is exacerbated by the fact that this behavior is not generally discovered until the light emitting diode is completely manufactured and tested. It would therefore be significantly beneficial if a means is provided to prevent the creation of the P-type conductivity region proximate the surface of the substrate in response to elevated temperatures.

SUMMARY OF THE INVENTION

The present invention prevents the creation of the P-type conductivity material proximate the surface of the substrate where the epitaxial layer is grown. It performs this function by using an N conductivity type dopant that can not convert to a P conductivity type material in place of silicon in the manufactured substrate. It performs this function by eliminating the use of silicon as the doping material when the substrate is manufactured. Instead of silicon, the present invention primarily uses group VI dopants to obtain the N-type behavior. In particular, tellurium-doped substrates are used in conjunction with silicon-doped epitaxial layers. However, it should be understood that the precise material used as a dopant in conjunction with the epitaxial layer is not critical to the present invention. The use of tellurium, or other group VI elements as the dopant for the substrate prevents the conversion of the upper surface of the substrate to P-type conductivity material and, therefore, avoids the creation of a device that behaves in the manner of a thyristor.

A preferred embodiment of the present invention comprises a substrate made of a group III–V material. An epitaxial layer is deposited on a first surface of the substrate in which the epitaxial layer comprises a group III–V material. The substrate is doped with a material that can not change its conductivity type in response to an elevated temperature. In a preferred embodiment of the present invention, the substrate comprises gallium arsenide and is doped with tellurium. In some circumstances, germanium could be used for these purposes even though it is a group IV element. Because of the processes normally used in manufacturing epitaxial devices, the portion of the epitaxial layer that is most proximate the substrate comprises N-type conductivity material. In addition, although a particularly preferred embodiment of the present invention uses tellurium to dope the substrate, alternative materials could be used as a dopant for the substrate as an alternative to the well known use of silicon as the dopant.

BRIEF DESCRIPTION OF THE DRAWINGS

The present invention will be more fully understood from a reading of the Description of the Preferred Embodiment in conjunction with the drawings, in which.

DESCRIPTION OF THE PREFERRED EMBODIMENT

Figure 1:
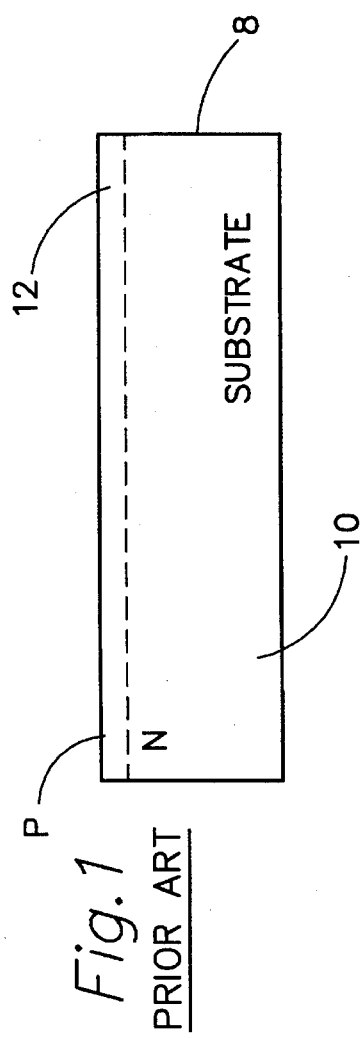
FIG. 1 illustrates a substrate made in accordance with known techniques.

Throughout the Description of the Preferred Embodiment, like components will be identified by like reference numerals.

FIG. 1 illustrates a substrate made in accordance with known techniques. The substrate 10 is made of gallium arsenide or gallium aluminum arsenide and is doped with silicon to result in an N-type conductivity material. Substrates of this type are usually manufactured with the intent of depositing an epitaxial layer on a predetermined surface of the substrate. This is commonly done in order to make a PN diode. The diode can be a light emitting diode, or LED.

During the manufacturing of the substrate and its subsequent processing, the substrate can reach elevated temperatures above 800° C. When the substrate reaches elevated temperatures, the arsenic near the surface can boil away and leave arsenic vacancies within the region of the substrate most proximate its surface on which the epitaxial layer will eventually be deposited. Although the problem exists primarily in the surface region of the substrate, it should be clearly understood that if the substrate remains at elevated temperatures for a sufficient period of time, the arsenic deficiencies could permeate throughout the entire structure of the substrate. When the arsenic vacancies occur because of the boiling away of arsenic in the surface region of the substrate, the silicon migrates to the arsenic vacancies and replaces the arsenic that has boiled away. The silicon exists throughout the substrate because of its use as the N-type conductivity dopant. When the silicon replaces the arsenic in the region of the surface, the substrate material is converted from an N-type conductivity material to a P-type conductivity material immediately proximate the substrate surface. This results in the substrate 8 having a region of N-type conductivity material 10 and a region of P-type conductivity material 12.

Figure 2:
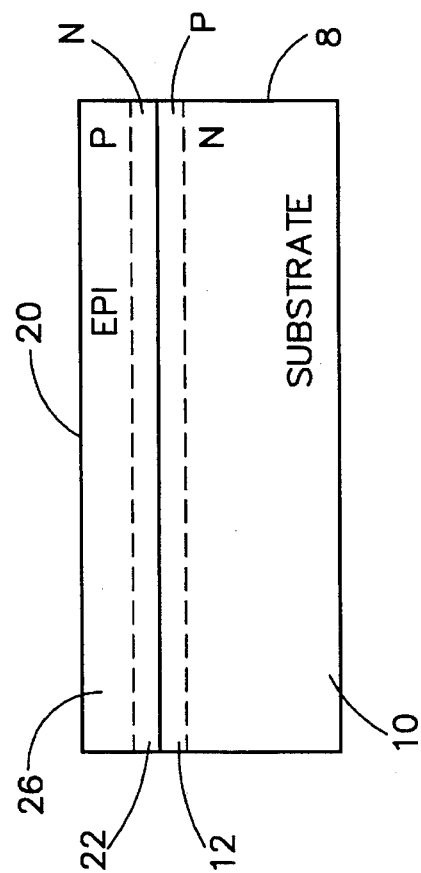
FIG. 2 illustrates the known substrate of FIG. 1 combined with an epitaxial layer in order to illustrate a problem that exists in the prior art.

When an epitaxial layer 20, as shown in FIG. 2, is grown on the surface of the substrate 8, the first portion of the epitaxial layer 20 to be deposited is of an N-type conductivity material. At elevated growth temperatures, silicon prefers the gallium site and acts as a donor. At lower growth temperatures, the silicon prefers the arsenic site and acts as an acceptor. A melt consists of gallium, gallium arsenide and silicon. The weight of gallium arsenide used is such that the gallium will be saturated with gallium arsenide at the temperature at which is comes into contact with the substrate to start the epitaxial growth process. The melt and substrates are heated in a furnace to a temperature above the saturation level and held at that temperature for approximately 30 minutes in order to assure that all constituents are dissolved and the melt is homogeneous. The melt and substrates are then allowed to begin cooling at a slow rate. When the temperature is at the saturation temperature, the substrates are placed in contact with a controlled volume of homogeneous melt and the cooling process continues to room temperature. The solubility of gallium arsenide in gallium is a function of temperature. Its solubility decreases as temperature is lowered. Therefore, gallium arsenide is growing continuously during the cooling process. As described above, the site that silicon occupies is a function of temperature and other conditions. It has been experimentally demonstrated that above a temperature of approximately 890 degrees centigrade silicon is incorporated preferentially on gallium sites. This produces an N conductivity type material. Gallium arsenide that grows below this temperature under these conditions is a P conductivity type material because the silicon is incorporating preferentially on arsenic sites. Later in the epitaxial deposition process, the material in the epitaxial layer is deposited as P-type conductivity material. As a result, a layer of N-type conductivity material 22 is deposited immediately on the upper surface of the substrate. Above the N-type conductivity material 22, a layer of P-type conductivity material 26 is deposited. As a result, the four regions illustrated in FIG. 2 result in the creation of an NPNP thyristor-like structure. When this occurs, the results are significantly deleterious and result in an unusable diode that must be scrapped. The creation of the P-type conductivity region 12 is the primary reason for this disadvantageous circumstance. The creation of region 12, as described above, results from the replacement of arsenic with silicon when the substrate is elevated to temperatures above 800° C.

Figure 3:
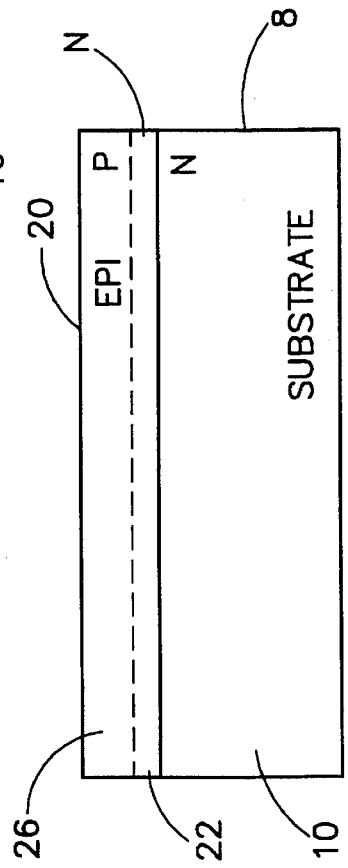
FIG. 3 a substrate and epitaxial layer made in accordance with the present invention.

The present invention avoids the problems described above in conjunction with FIGS. 1 and 2 by using tellurium to dope the substrate instead of silicon. Tellurium is a donor on the arsenic site. Since the tellurium is already on the arsenic site, arsenic vacancies will have no affect. Tellurium will not change sites because tellurium is already almost exclusively located on arsenic sites as a donor. Therefore, it can't change conductivity type. When gallium arsenide is grown with tellurium doping, the tellurium is incorporated onto arsenic sites almost exclusively. There is no obvious manner for incorporating tellurium on any site that would make it behave as an acceptor. This is true for all group VI elements. Therefore, the substrate 8 only has an N-type conductivity region 10. When the epitaxial layer 20 is deposited on the surface of the substrate, the N-type conductivity region 22 is first created, for the reasons described above, and then the P-type conductivity region 26 is created. Because of the absence of region 12 in a device made in accordance with the present invention, the thyristor-like behavior is avoided. The device illustrated schematically in FIG. 3 provides a PN diode which does not exhibit thyristor-like behavior.

The procedure described above, wherein the silicon replaces the arsenic in the arsenic vacancies, results from the fact that silicon has four electrons, gallium has three valence electrons and arsenic has five valence electrons. Tellurium has six valence electrons. Five of the six valence electrons are used to complete bonds on arsenic sites and the sixth valence electron is a conduction electron. The reason for this behavior is that the silicon in the gallium arsenide is amphoteric and can act as a donor or acceptor, depending upon whether it is on a gallium or arsenic site and it can electronically, chemically and geometrically occupy that site. In group IV semiconductors, such as silicon and germanium, the elements have four outer electrons and can crystallize in a cubic diamond lattice in which each atom has four equivalent neighbors. For silicon, each silicon atom shares its four outer electrons with its four nearest neighbor silicon atoms which also share in a like manner. Therefore, between each pair of silicon atoms there is a bond of two electrons in which one electron is from each of the two silicon atoms. Doping is accomplished by using either a group III or group V element. Group III elements will dope as a P-type material and group V elements will dope as an N-type material. Group III elements have electronics shells with three electrons in the outer most shell and group V elements have electronics shells with five electrons in the outer most shell. When a group V element substitutes for a silicon atom, it will be noted that the site will have an excess electron. This is a donor site of N type conductivity. When a group III substitutes for a silicon atom it will be noted that one of the bonds will be deficient of an electron. This will create a P-type acceptor site. Group III–V semiconductors are similar in general but differ in specifics to the description above. Group II elements, such as zinc and cadmium, substitute on group III sites as acceptors. Group VI elements, such as tellurium, sulfur and selenium, substitute on group V sites as donors. Group IV elements may go either to the group III or group V sites. In gallium arsenide, it has been demonstrated that silicon and germanium can go either way. Germanium is not as predictable and useful in this respect as silicon. When a group IV element goes to a group III site, there is a single excess electron condition and therefore it becomes a donor. When a group IV element goes on a group V site there is a single electron deficiency and thus an acceptor condition. If the temperature of the substrate is elevated to certain temperatures, the silicon prefers to migrate to the arsenic vacancies created when the arsenic evaporates. As a result, the P-type conductivity region 12 is created. The use of tellurium as a dopant for the substrate eliminates the replacement of the arsenic with silicon and therefore does not contribute to the creation of region 12. The structure shown in FIG. 3 results from the growth of the epitaxial layer 20 instead of the disadvantageous structure shown in FIG. 2.

Although the present invention has been described in terms of the use of tellurium as a dopant for the substrate, it should be understood that other group VI elements could be used. In addition, under certain circumstances, germanium can be used even though it is a group IV element.

The embodiments of the invention in which an exclusive property or right is claimed are defined as follows:

1. A light emitting diode, comprising:

a substrate comprising gallium arsenide; and an epitaxial layer deposited on a first surface of said substrate, said epitaxial layer comprising gallium arsenide doped with an amphoteric material, said substrate being doped with a group VI material.

2. The light emitting diode of claim 1, wherein:

said epitaxial layer comprises N-type conductivity material proximate said first surface of said substrate.

3. The light emitting diode of claim 1, wherein:

said amphoteric material is silicon.

4. The light emitting diode of claim 1, wherein:

said group VI material is tellurium.

\* \* \* \* \*